(12) United States Patent
Seo et al.

(10) Patent No.: US 9,299,789 B2
(45) Date of Patent: Mar. 29, 2016

(54) MEMORY DEVICES INCLUDING GRAPHENE SWITCHING DEVICES

(71) Applicant: Samsung Electronics Co., Ltd., Suwon-Si, Gyeonggi-Do (KR)

(72) Inventors: David Seo, Yongin-si (KR); Ho-jung Kim, Suwon-si (KR); Hyun-jong Chung, Hwaseong-si (KR); Seong-jun Park, Seoul (KR); Kyung-eun Byun, Uijeongbu-si (KR); Hyun-jae Song, Hwaseong-si (KR); Jin-seong Heo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 198 days.

(21) Appl. No.: 13/943,006

(22) Filed: Jul. 16, 2013

(65) Prior Publication Data

US 2014/0097404 A1 Apr. 10, 2014

(30) Foreign Application Priority Data

Oct. 8, 2012 (KR) ........................ 10-2012-0111379

(51) Int. Cl.
| | |
|---|---|
| *H01L 29/06* | (2006.01) |
| *H01L 29/16* | (2006.01) |
| *H01L 29/66* | (2006.01) |
| *H01L 29/772* | (2006.01) |
| *H01L 29/872* | (2006.01) |
| *H01L 29/88* | (2006.01) |
| *H01L 29/40* | (2006.01) |

(52) U.S. Cl.
CPC ...... *H01L 29/1606* (2013.01); *H01L 29/66977* (2013.01); *H01L 29/772* (2013.01); *H01L 29/872* (2013.01); *H01L 29/88* (2013.01); *H01L 29/407* (2013.01)

(58) Field of Classification Search
CPC ..................... H01L 29/1606; H01L 29/66015; H01L 29/775; H01L 29/78; H01L 29/165; H01L 29/08; H01L 29/872
See application file for complete search history.

(56) References Cited

U.S. PATENT DOCUMENTS

| | | | |
|---|---|---|---|
| 7,944,728 | B2 | 5/2011 | Nian et al. |
| 8,048,474 | B2 | 11/2011 | Kumar et al. |
| 8,107,270 | B2 | 1/2012 | Scheuerlein et al. |

(Continued)

FOREIGN PATENT DOCUMENTS

| | | |
|---|---|---|
| KR | 2011-0081683 A | 7/2011 |
| KR | 20110081183 A | 7/2011 |
| KR | 1089066 | 9/2011 |

OTHER PUBLICATIONS electroiq.com blog, Graphene: semimetal, not semiconductor, insulator, or metal, Jul. 15, 2011.*

(Continued)

*Primary Examiner* — Whitney T Moore
*Assistant Examiner* — Joseph Galvin, III
(74) *Attorney, Agent, or Firm* — Harness, Dickey & Pierce, P.L.C.

(57) ABSTRACT

A memory device includes a graphene switching device having a source electrode, a drain electrode and a gate electrode. The graphene switching device includes a Schottky barrier formed between the drain electrode and a channel in a direction from the source electrode toward the drain electrode. The memory device need not include additional storage element.

20 Claims, 10 Drawing Sheets

(56) References Cited

U.S. PATENT DOCUMENTS

| | | | |
|---|---|---|---|
| 2010/0124095 A1* | 5/2010 | Jung | G11C 7/12 |
| | | | 365/148 |
| 2010/0258787 A1 | 10/2010 | Chae et al. | |
| 2011/0220865 A1* | 9/2011 | Miyata | B82Y 10/00 |
| | | | 257/12 |
| 2011/0291068 A1* | 12/2011 | Kobayashi | H01L 29/66742 |
| | | | 257/9 |
| 2012/0032227 A1* | 2/2012 | Seabaugh | H01L 29/7391 |
| | | | 257/105 |
| 2012/0080656 A1 | 4/2012 | Choi et al. | |
| 2013/0214252 A1* | 8/2013 | Park | B82Y 30/00 |
| | | | 257/29 |

OTHER PUBLICATIONS

Ning Zhan et al., Graphene Based Nickel Nanocrystal Flash Memory, App. Phys. Lett. 99, 2011.

Augustin J. Hong et al., Graphene Flash Memory, 2011 American Chemical Society, vol. 5, No. 10, pp. 7812-7817.

* cited by examiner

MEMORY DEVICES INCLUDING GRAPHENE SWITCHING DEVICES

CROSS-REFERENCE TO RELATED APPLICATIONS

This application claims priority under 35 U.S.C. §119 to Korean Patent Application No. 10-2012-0111379, filed on Oct. 8, 2012, in the Korean Intellectual Property Office, the disclosures of which are incorporated herein in their entirety by reference.

BACKGROUND

1. Field

Example embodiments relate to memory cells, memory devices, and memory arrays including graphene switching devices.

2. Description of the Related Art

A unit cell of a conventional memory device includes a storage node and a switching device. For example, a conventional dynamic random access memory (DRAM) cell includes a single transistor and a single capacitor.

Graphene has a 2-dimensional hexagonal carbon structure. In recent years, research has been conducted on graphene as a novel material capable of superseding semiconductors worldwide. In one example, graphene may be used as a zero-gap semiconductor for a switching device. In this instance, a bandgap should be formed in graphene or a structure adopting graphene. A graphene Schottky diode is a graphene device functioning as a Schottky diode.

SUMMARY

Example embodiments provide memory cells, memory devices and memory arrays including graphene switching devices without additional storage nodes.

Additional aspects will be set forth in part in the description which follows and, in part, will be apparent from the description, or may be learned by practice of example embodiments described herein.

At least one example embodiment provides a memory device including: a graphene switching device having a source electrode, a drain electrode, and a gate electrode, and the graphene switching device including a Schottky barrier between the drain electrode and a channel in a direction from the source electrode toward the drain electrode.

At least one other example embodiment provides a memory array. According to at least this example embodiment, the memory array includes: a plurality of graphene switching devices arranged in a plurality of rows and a plurality of columns; a plurality of word lines, each of the plurality of word lines being connected to gate electrodes of graphene switching devices on a corresponding column; a plurality of bit lines, each of the plurality of bit lines being connected to drain electrodes of graphene switching devices on a corresponding row; and a plurality of source lines, each of the plurality of source lines being connected to source electrodes of graphene switching devices on a corresponding column. Each of the plurality of graphene switching devices includes: a Schottky barrier formed between the drain electrode and a channel in a direction from the source electrode toward the drain electrode.

At least one other example embodiment provides a memory cell including: a graphene switching device including a Schottky barrier between a drain electrode and a channel, the graphene switching device being configured to store data without an additional storage node.

At least one other example embodiment provides a memory array including: a plurality of memory cells, each of the plurality of memory cells being configured to store data using the graphene switching device without an additional storage node. Each memory cell includes: a graphene switching device including a Schottky barrier between a drain electrode and a channel, the graphene switching device being configured to store data without an additional storage node.

According to at least some example embodiments, the drain electrode and an insulating layer may be on respective first and second regions of a semiconductor substrate. The first and second regions may be spaced apart from each other. A semi-metal layer may be interposed between the drain electrode and the insulating layer on the substrate, and may extend onto the insulating layer. The semi-metal layer may function as the channel. The source electrode may be on the semi-metal layer and face the insulating layer. A gate oxide layer may cover the semi-metal layer, and the gate electrode on the gate oxide layer. The substrate may form the Schottky barrier between the semi-metal layer and the drain electrode.

The semiconductor substrate may include silicon (Si), germanium (Ge), silicon-germanium (SiGe), a Group III-V semiconductor, a Group II-VI semiconductor, semiconductor carbon nanotubes (CNTs), molybdenum sulfide ($MoS_2$), indium zinc oxide (IZO), gallium indium zinc oxide (GIZO), or the like.

The drain electrode may be spaced apart from the semi-metal layer. A distance between the semi-metal layer and the drain electrode may range from about 1 nm to about 30 nm. The drain and source electrodes may be formed of a metal or polysilicon (poly-Si). The semi-metal layer may be a graphene layer or a metal carbon nanotube (CNT) mesh. The graphene layer may have a multi-layer structure including a plurality of (e.g., 1 to 4) graphene layers.

The height of the Schottky barrier of the substrate may vary according to a voltage applied to the gate electrode.

According to at least some example embodiments, the drain electrode and an insulating layer may be on respective first and second regions of a conductive semiconductor substrate. A plurality of metal bumps may be formed on a surface of the semiconductor substrate between the first region and the second region. A semi-metal layer may be on the plurality of metal bumps, and extend onto the insulating layer. The source electrode may be on the semi-metal layer in the second region and face the insulating layer. A gate oxide layer may cover the semi-metal layer. The gate electrode may be on the gate oxide layer. The semiconductor substrate may form the Schottky barrier between the semi-metal layer and the drain electrode According to at least some example embodiments, a plurality of grooves may be formed on the surface of the substrate to correspond to the plurality of metal bumps. An insulating material may fill the plurality of grooves.

The metal bumps may be surrounded by the insulating material and upper surfaces of the plurality of metal bumps may contact the semi-metal layer. The metal bumps may be on the insulating material and have top surfaces that contact the semi-metal layer.

The memory array may further include an organic layer between the metal bumps and the semi-metal layer. The organic layer may include an organic material containing amino groups, hydroxyl groups, hydrogen ions, or the like. The organic layer may have a thickness of about 1 nm to about 3 nm.

The metal bumps may have a size of about 1 nm to about 10 nm. The metal bumps may be formed at intervals of about 10 nm to about 30 nm.

BRIEF DESCRIPTION OF THE DRAWINGS

Example embodiments will become apparent and more readily appreciated from the following description of the drawings, in which.

DETAILED DESCRIPTION

Figure 1:
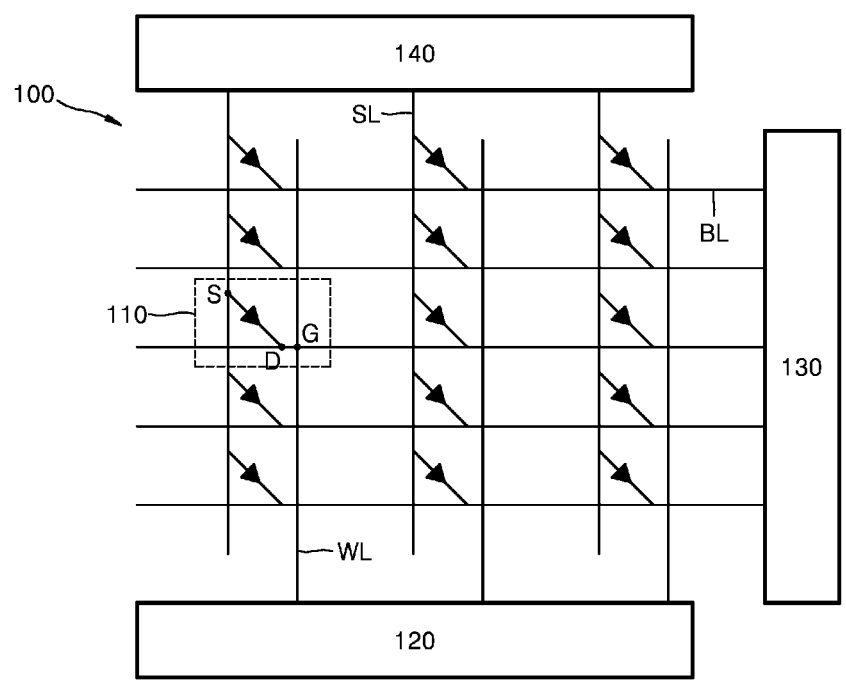
FIG. 1 is a schematic circuit diagram of a memory array including graphene switching devices according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

FIG. 1 is a schematic circuit diagram of a memory array 100 including graphene switching devices according to an example embodiment. The memory array 100 may also be referred to as a memory device.

Referring to FIG. 1, the memory array 100 is a matrix array including a plurality of memory cells. Each memory cell 110 is a graphene switching device as described later. The graphene switching device may function as both a diode and a transistor, and thus, an additional storage unit is not necessary. For example purposes, each memory cell 110 is illustrated as a diode in FIG. 1. However, each memory cell 110 may have a field-effect transistor (FET) structure.

Each memory cell 110 includes a source electrode 5, a drain electrode D, and a gate electrode G.

Gate electrodes G in the same column are connected to a word line WL, and word lines WL are connected to a first column driver 120.

Drain electrodes D in the same row are connected to a bit line BL, and bit lines BL are connected to a row driver 130.

Source electrodes S in the same column are connected to a source line SL, and source lines SL are connected to a second column driver 140.

In the example embodiment shown in FIG. 1, each memory cell 110 is a graphene switching device including a tunable barrier containing a semiconductor barrier.

Figure 2:
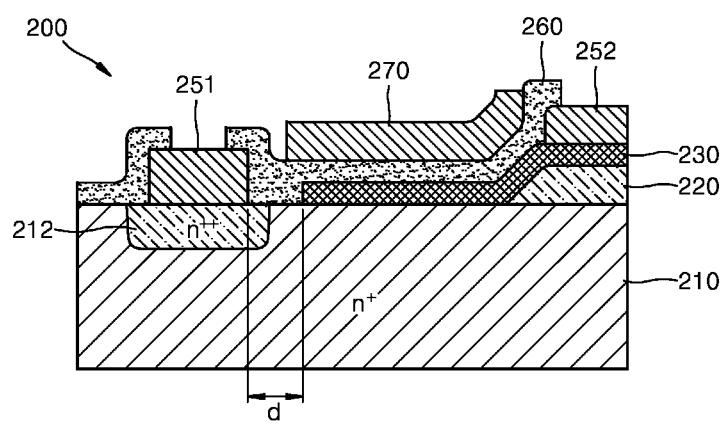
FIG. 2 is a schematic cross-sectional view of a graphene switching device according to an example embodiment.

FIG. 2 is a schematic cross-sectional view of an example embodiment of a graphene switching device 200 including a tunable barrier containing a semiconductor barrier. The graphene switching device 200 corresponds to a memory cell in FIG. 1.

Referring to FIG. 2, a first electrode 251 is formed on a first region of a substrate 210, and an insulating layer 220 is formed on a second region of the substrate 210. The second region is spaced apart from the first region on the substrate 210.

A graphene layer 230 is formed apart from the first electrode 251 on the substrate 210 and extends from a region between the first and second regions onto the insulating layer 220. A distance d between the graphene layer 230 and the first electrode 251 may range from about 1 nm to about 30 nm. Also, a second electrode 252 is formed opposite to the insulating layer 220 with the graphene layer 230 in the second region therebetween. A gate oxide layer 260 is formed on the substrate 210 to cover a portion of the graphene layer 230. A gate electrode 270 is formed on the gate oxide layer 260.

Although FIG. 2 illustrates the graphene layer 230 used as a channel, example embodiments are not limited to this example. For example, the channel may include a semi-metal layer formed of a bandgap-free semiconductor (e.g., a metal carbon nanotube (CNT) mesh layer). Hereinafter, it is assumed for brevity that the graphene layer 230 is used as the channel. However, the graphene layer 230 may be replaced by a semi-metal layer containing a metal CNT mesh.

Still referring to FIG. 2, in this example embodiment, the first electrode 251 and the second electrode 252 may function as a drain electrode and a source electrode, respectively. The first and second electrodes 251 and 252 may be formed of a metal or polysilicon (poly-Si).

The substrate 210 may be a semiconductor substrate formed of, for example, silicon (Si), germanium (Ge), silicon-germanium (SiGe), a Group III-V semiconductor, a Group II-VI semiconductor, semiconducting CNT, molybdenum sulfide ($MoS_2$), indium zinc oxide (IZO), gallium indium zinc oxide (GIZO), or the like. The semiconductor substrate 210 may be doped with an n-type dopant or a p-type dopant.

As shown in FIG. 2, the semiconductor substrate 210 is opposite the gate electrode 270 with the graphene layer 230 therebetween. Accordingly, an energy band of the semiconductor substrate 210 may be affected by a gate voltage, and the substrate 210 may function as the tunable barrier (also referred to as the semiconductor barrier).

A first well 212 is formed in a contact region between the substrate 210 and the first electrode 251. The first well 212 is relatively heavily doped with a dopant having the same polarity as the substrate 210. For instance, when the substrate 210 is doped with an n+ dopant as shown in FIG. 2, the first well 212 may become an n++ region. In at least this example embodiment, the graphene switching device 200 may be a unipolar transistor, which may be an n-type transistor or p-type transistor depending on the polarity of the semiconductor substrate 210 serving as the semiconductor barrier. In this case, when the semiconductor substrate 210 is doped with an n-type dopant, the graphene switching device 200 including the tunable barrier is an n-type transistor. When the semiconductor substrate 210 is doped with a p-type dopant, the graphene switching device including the tunable barrier is a p-type transistor. In this case, the first well 212 is a p++ region.

When the graphene switching device 200 of FIG. 2 is an n-type transistor, the second electrode 252 may function as a source electrode, and the first electrode 251 may function as a drain electrode Still referring to FIG. 2, the gate oxide layer 260 may be formed of silicon oxide or silicon nitride.

The formation of the graphene layer 230 may include transferring graphene manufactured using a chemical vapor deposition (CVD) process, and then patterning the graphene. The graphene layer 230 may have a multi-layer structure including a plurality of (e.g., 1-4) layers of graphene. The graphene layer 230 may be a path through which carriers move, and may have a zero or substantially zero bandgap.

FIGS. 3A through 3D are energy band diagrams for explaining example functionality of the graphene switching device 200 of FIG. 2.

Figure 3A:
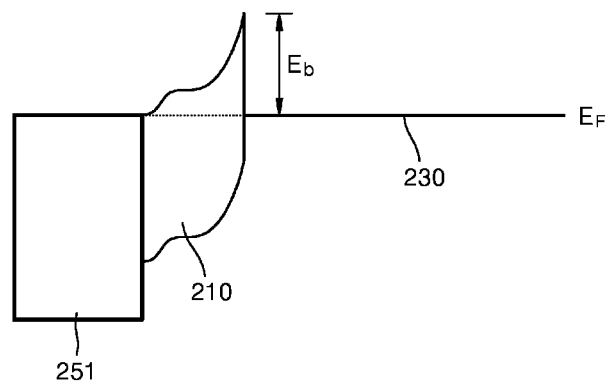
FIGS. 3A through 3D are energy band diagrams for explaining example functionality of the graphene switching device of FIG. 2.
Figure 3B:
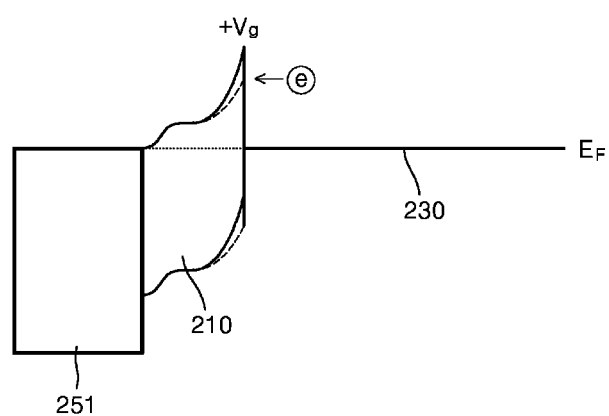

FIGS. 3A and 3B are diagrams for explaining an n-type graphene switching device. FIG. 3A shows a state of the n-type graphene switching device before a gate voltage is applied. FIG. 3B shows a state of the n-type graphene switching device after the gate voltage is applied.

Referring to FIG. 3A, before the gate voltage is applied to the gate electrode 270, the graphene layer 230 and the first electrode 251 may respectively form energy band structures corresponding to work functions thereof on both sides of the semiconductor substrate 210. Since the graphene switching device includes an n-type semiconductor substrate 210, the main carriers are electrons. The semiconductor substrate 210 between the first electrode 251 and the graphene layer 230 forms an energy barrier therebetween. The energy barrier is referred to as a Schottky barrier. In at least this example embodiment, the semiconductor substrate 210 may be referred to as a semiconductor barrier. Migration of carriers may be suppressed and/or restricted by an energy barrier $E_b$ between the graphene layer 230 and the semiconductor substrate 210. In FIGS. 3A and 3B, energy $E_F$ refers to a Fermi energy level of the graphene layer 230.

Referring to FIG. 3B, when a given, desired or predetermined positive gate voltage +Vg is applied to the gate electrode 270 and a given, desired or predetermined voltage applied to the first and second electrodes 251 and 252, the height of the energy barrier $E_b$ decreases as illustrated by the dotted lines. Accordingly, electrons move more easily from the graphene layer 230 to the first electrode 251, and current may flow in the graphene switching device 200 due to the gate voltage. Thus, the graphene switching device 200 may function as a field effect transistor (FET). The graphene layer 230 may function as a carrier path and be distinguished from a channel of a conventional FET.

With a reduction in the energy barrier $E_b$, electrons may move through the semiconductor substrate 210 due to a tunneling effect of the semiconductor substrate 210.

As the gate voltage increases, the height of the energy barrier $E_b$ may further decrease. Accordingly, the energy barrier $E_b$ is adjustable.

Figure 4:
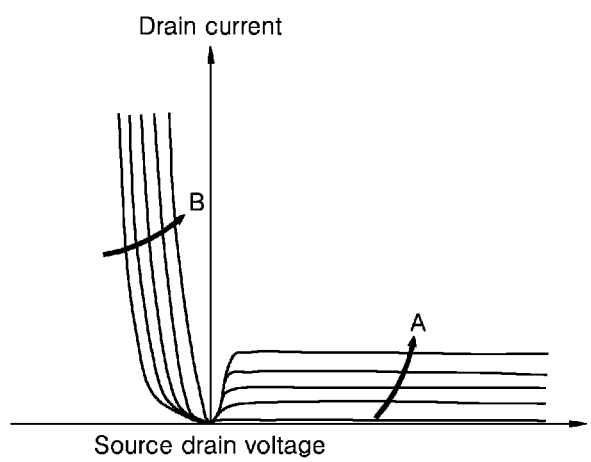
FIG. 4 is an example current-voltage (I-V) characteristic curve for an n-type graphene switching device according to an example embodiment.

FIG. 4 is a curve showing example current-voltage (I-V) characteristics of the example embodiment of the n-type graphene switching device of FIG. 2.

Referring to FIG. 4, if the source-drain voltage is a positive voltage, then as the gate voltage increases the height of the energy barrier $E_b$ may be reduced and a drain current may increase in the direction indicated by an arrow A.

In FIGS. 3A and 3B, when a negative voltage is applied as the source-drain voltage to the graphene switching device 200 including the n-type semiconductor substrate 210, electrons may move more smoothly without the energy barrier. However, when a positive voltage is applied as the source-drain voltage, electrons may not move smoothly due to the energy barrier. Accordingly, the graphene switching device 200 may function as a diode. In this case, the graphene switching device 200 may be referred to as a graphene Schottky diode.

When the negative voltage is applied as the source-drain voltage, the magnitude of the energy barrier may vary due to an increase in gate voltage. Thus, a drain current may increase in the direction indicated by arrow B in FIG. 4 to control diode characteristics.

Figure 3C:
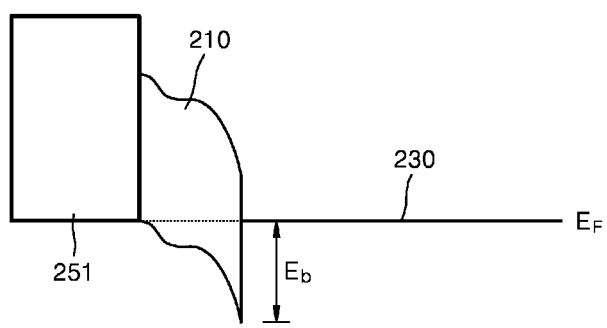
Figure 3D:
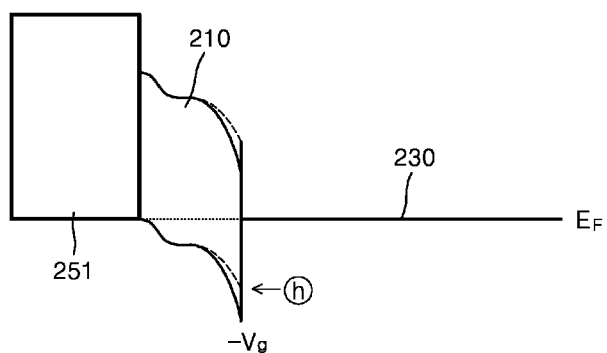

FIGS. 3C and 3D are diagrams for explaining an example embodiment of a p-type graphene switching device. FIG. 3C shows a state of the p-type graphene switching device before a gate voltage is applied, and FIG. 3D shows a state of the p-type graphene switching device after the gate voltage is applied.

Referring to FIG. 3C, before a gate voltage is applied to the gate electrode 270, the graphene layer 230 and the first electrode 251 form energy band structures corresponding to work functions thereof on both sides of the semiconductor substrate 210. Since the graphene switching device includes a p-type semiconductor substrate 210, the main carriers are holes. The semiconductor substrate 210 between the first electrode 251 and the graphene layer 230 may form an energy barrier therebetween. Migration of carriers may be suppressed and/or restricted by an energy barrier $E_b$ between the graphene layer 230 and the semiconductor substrate 210. In FIGS. 3C and 3D, energy $E_F$ refers to a Fermi energy level of the graphene layer 230.

Referring to FIG. 3D, when a given, desired or predetermined negative gate voltage −Vg is applied to the gate electrode 270 and a given, desired or predetermined voltage applied to the first and second electrodes 251 and 252, the energy barrier $E_b$ may be reduced as illustrated by the dotted lines. Accordingly, holes may move more easily from the graphene layer 230 to the first electrode 251. In other words, current may flow in the graphene switching device 200 due to the gate voltage. Thus, the graphene switching device 200 may function as a FET.

With a reduction in the energy barrier $E_b$, holes may move through the semiconductor substrate 210 due to a tunneling effect of the semiconductor substrate 210.

As the gate voltage increases, the energy barrier $E_b$ may further decrease. Accordingly, the energy barrier $E_b$ may be adjustable.

Figure 5:
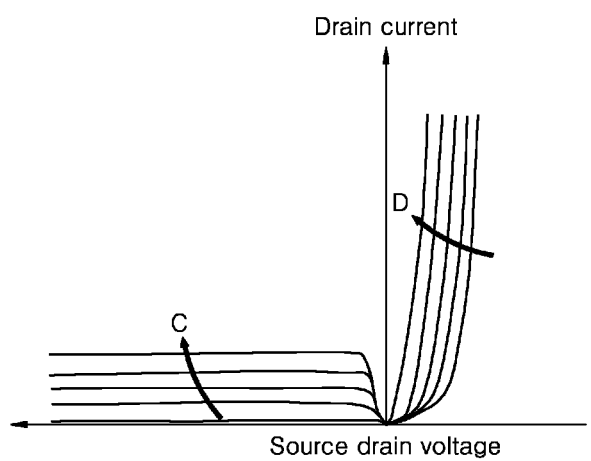
FIG. 5 is an example I-V characteristic curve for a p-type graphene switching device according to an example embodiment.

FIG. 5 is a curve showing example I-V characteristics of the example embodiment of the p-type graphene switching device of FIG. 2.

Referring to FIG. 5, if the source-drain voltage is a negative voltage, then as the gate voltage increases the energy barrier $E_b$ may be reduced and a drain current may increase in the direction indicated by arrow C.

In FIGS. 3C and 3D, when a positive voltage is applied as the source-drain voltage to the graphene switching device 200 including the p-type semiconductor substrate 210, holes may move more smoothly without the energy barrier. However, when a negative voltage is applied as the source-drain voltage, holes may not move smoothly due to the energy barrier. Accordingly, the graphene switching device 200 may function as a diode. In this case, the graphene switching device 200 may be referred to as a graphene Schottky diode.

When the positive voltage is applied as the source-drain voltage, the energy barrier may be adjusted to a relatively low magnitude due to an increase in gate voltage. Thus, the holes may increase in the direction indicated by arrow D, and diode characteristics may be controlled.

Referring back to FIGS. 1 and 2, each of the memory cells 110 may be a graphene switching device 200. In FIG. 2, when the graphene switching device 200 is an n-type graphene switching device 200, the first electrode 251 is a drain electrode, and the second electrode 252 is a source electrode. When the graphene switching device 200 is a p-type graphene switching device, the first electrode 251 is a drain electrode, and the second electrode 252 is a source electrode.

Figure 6:
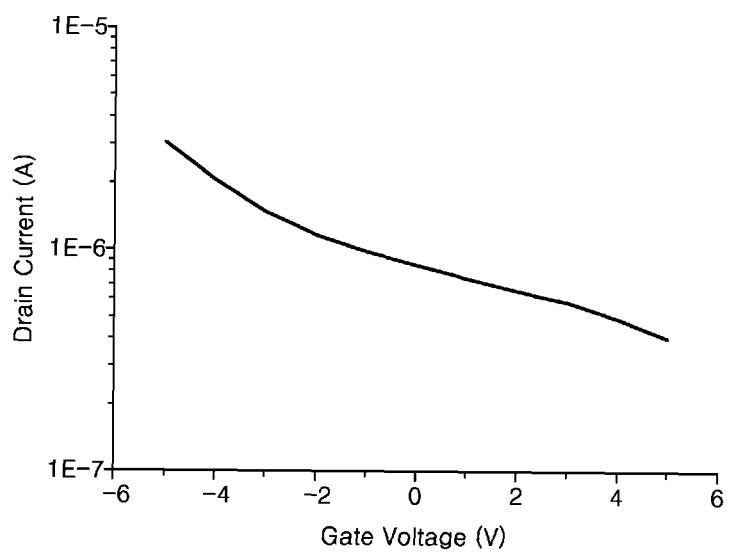
FIG. 6 is a graph showing example drain current characteristics for an example embodiment of the graphene switching device of FIG. 2 in response to an application of a gate voltage.

FIG. 6 is a graph showing example drain current characteristics of the example embodiment of the graphene switching device of FIG. 2 with application of a gate voltage.

Referring to FIG. 6, it can be seen that a drain current varies according to the gate voltage (e.g., a programming voltage).

Figure 7:
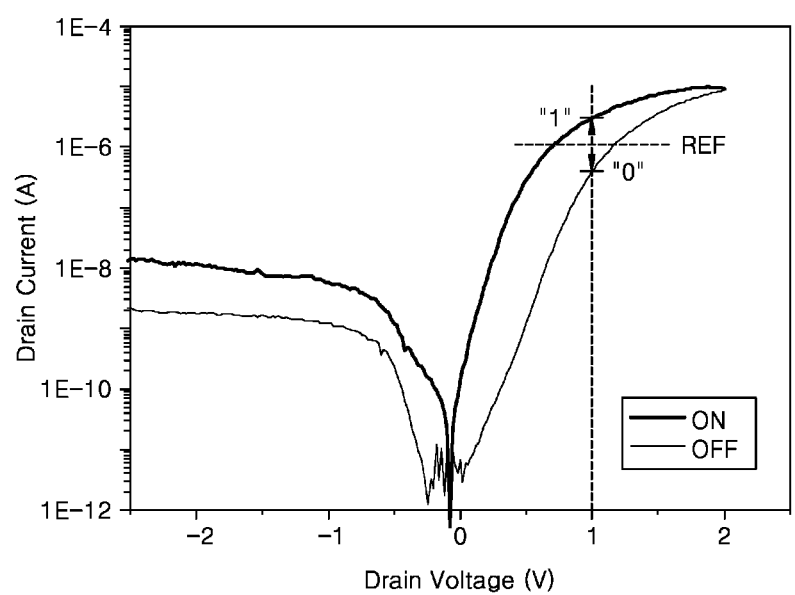
FIG. 7 is a graph showing example drain current characteristics depending on application of a programming voltage.

FIG. 7 is a graph showing example drain current characteristics depending on an application of the programming voltage. In this example, an ON programming voltage of about −4 V was applied, and an OFF programming voltage of about 4 V was applied.

In this example, the graphene switching device transitions to a low resistance state (if not already in the low resistance state) in response to application of the ON programming voltage. In the low resistance state, the graphene switching device has a relatively low resistance and a relatively high drain current was measured in response to application of a given, desired or predetermined voltage of, for example, about 1V.

In response to application of the OFF programming voltage, the graphene switching device transitions to the high resistance state (if not already in the high resistance state). In the high resistance state, the graphene switching device has a relatively high resistance and a relatively low drain current was measured in response to application of a given, desired or predetermined voltage of, for example, about 1V.

In the example shown in FIG. 7, when a drain current higher than a reference current REF is detected in response to a given, desired or predetermined voltage of, for example, about 1V, applied to a drain electrode, the state of the graphene switching device is read as an ON state.

In contrast, when a drain current lower than the reference current REF is detected in response to the application of the given, desired or predetermined voltage, the state of the graphene switching device is read as an OFF state. If the ON state is stored as data "1" and the OFF state is stored as data "0", then the graphene switching device alone may function as a memory cell without an additional storage unit.

An example embodiment of a method of driving the memory array 100 including the graphene switching devices shown in FIG. 1 will be described in more detail below. Hereinafter, an n-type graphene switching device will be described as an example. However, a p-type graphene switching device may function in the same or substantially the same manner.

Write Operation

With regard to the example embodiment shown in FIG. 1, the row driver 130 applies a selection voltage to a bit line BL extending across a memory cell in which data will be written. A first column driver 120 applies a write voltage (e.g., about −4 V) to a word line WL extending across a memory cell in which data will be written. By applying the selection voltage and the write voltage, a memory cell is selected, and data is written to the selected memory cell. In this example, the memory cell is put into a low resistance state, and data "1" is stored in the memory cell. Before the application of the write voltage, the memory cell is in a high resistance state, and data "0" is stored in the memory cell.

Read Operation

Figure 8:
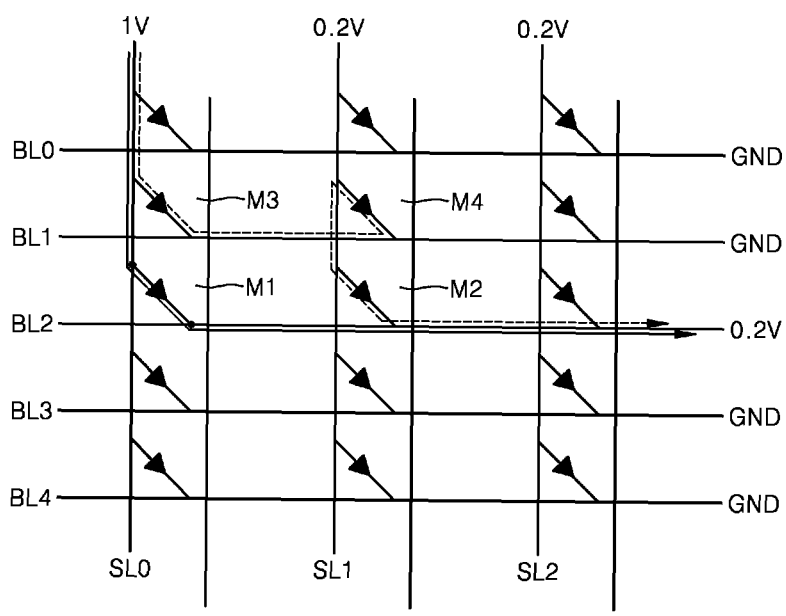
FIG. 8 is a circuit diagram illustrating an example read operation.

FIG. 8 is a circuit diagram illustrating an example embodiment of a read operation.

Referring to FIG. 8, the row driver applies a selection voltage (e.g., about 0.2 V) to a bit line BL2 extending across a memory cell from which data will be read. A second column driver applies a read voltage (e.g., about 1 V) to a source line SL0 extending across a memory cell from which data will be read. A voltage that is the same or substantially the same as the selection voltage is applied to source lines other than the source line extending across the memory cell from which data will be read. By applying the voltages in the manner discussed above, a memory cell from which data will be read is selected.

Still referring to FIG. 8, the memory cell from which data will be read is memory cell M1. Memory cells M2 to M4 are memory cells disposed around the memory cell M1. In this example, the memory cell M1 is in an "OFF" state, which is a high resistance state, while the memory cells M2 to M4 are in an "ON" state, which is a low resistance state. A read path (illustrated by a solid line) passing through the memory cell M1 that is in the high resistance state reads high-resistance state data. If a path passing through the memory cells M3, M4, and M2 in this order (illustrated with a dotted line) has a lower resistance than the path passing through the memory cell M1, reading errors may occur. However, the path passing through the memory cells M3 and M2, in which a diode is forward, has a low resistance, but a diode in the memory cell M4 is read in a reverse direction. Since the path passing through the memory cells M3, M4, and M2 has a higher resistance, reading errors may be suppressed in the memory array 100 according to at least some example embodiments.

In at least one example embodiment, when a read drain current is larger than a given, desired or predetermined reference current REF, data "1" may be read, whereas when the read drain current is smaller than the reference current REF, data "0" may be read.

Erase Operation

In an example erase operation, the row driver applies a selection voltage to a bit line extending across a memory cell from which data will be erased. The first column driver applies an erase voltage (e.g., about 4V) to a word line extending across the memory cell from which data will be erased. By applying the selection and the erase voltage as discussed above, the memory cell in which data will be erased is selected. The application of the erase voltage puts the memory cell into a high resistance state, and data "0" may be written.

Figure 9:
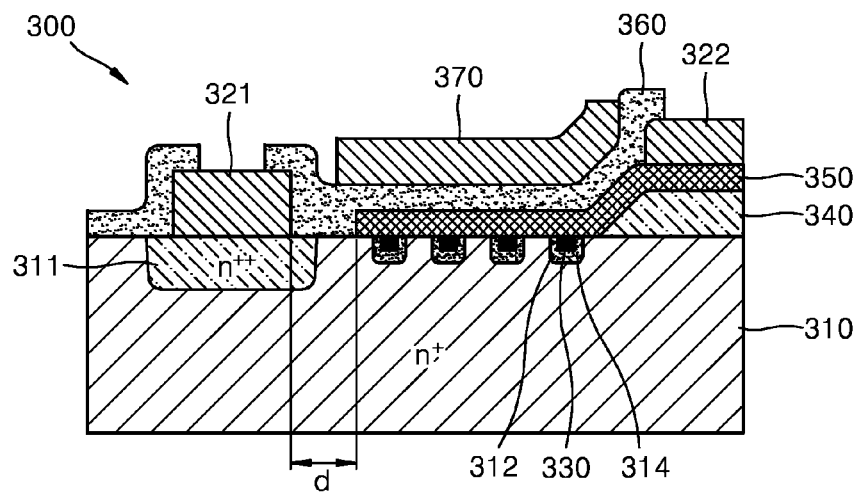
FIG. 9 is a schematic cross-sectional view of a graphene switching device according to another example embodiment.

FIG. 9 is a schematic cross-sectional view of an example embodiment of a graphene switching device 300 including a tunable barrier containing a semiconductor barrier.

Referring to FIG. 9, a first electrode 321 is on a first region of a semiconductor substrate 310, and an insulating layer 340 is formed on a second region of the substrate 310. The second region is spaced apart from the first region. A graphene layer 350 is formed on a third region between the first and second regions of the substrate 310 and extends onto the insulating layer 340. The graphene layer 350 is spaced apart from the first electrode 321. A distance d between the graphene layer 350 and the first electrode 321 may be about 1 nm to about 30 nm. A second electrode 322 is formed opposite to the insulating layer 340 with the graphene layer 350 in the second region therebetween.

Although FIG. 9 illustrates the insulating layer 340 formed on the surface of the substrate 310, example embodiments are not limited thereto. For example, the insulating layer 340 may be formed by oxidizing the surface of the substrate 310.

Still referring to FIG. 9, a first well 311 is in a contact region between the substrate 310 and a first electrode 351. The first well 311 may be heavily doped with a dopant having the same polarity as the substrate 310. For example, when the substrate 310 is doped with an n+ dopant as shown in FIG. 9, the first well 311 may be an n++ region. The graphene switching device 300 may be a unipolar transistor, which may be an n-type transistor or p-type transistor depending on the polarity of the semiconductor substrate 310 serving as the semiconductor barrier. For example, when the semiconductor substrate 310 is doped with an n-type dopant as in FIG. 9, the graphene switching device 300 including the tunable barrier may be an n-type transistor. When the semiconductor substrate 310 is doped with a p-type dopant, the graphene switching device including the tunable barrier may be a p-type transistor. In this case, the first well 311 may be a p++ region.

A plurality of grooves 312 are formed on a surface of the substrate 310, and metal bumps 330 are formed in the respective grooves 312 in contact with a graphene layer 350. An insulating material 314 is formed within the grooves 312 to surround a bottom and sides of the metal bumps 330, and suppress and/or prevent the metal bumps 330 from contacting the substrate 310. The metal bumps 330 may be formed of Pt, Au, Pd, Co, Y, Gd, Ca, Ti, an alloy thereof or the like. The metal bumps 330 may have a size of about 1 nm to about 10 nm and be formed at an interval of about 10 nm to about 30 nm.

Each of the grooves 312 may be a trench having a relatively large depth. In this case, the metal bumps 330 may be formed at an aspect ratio of about 1 to about 10.

Still referring to FIG. 9, a gate oxide layer 360 is formed on the substrate 310 to cover a portion of the graphene layer 350. A gate electrode 370 is formed on the gate oxide layer 360.

The first electrode 321 is one of a source and drain electrode, and the second electrode 322 is the other of the source and drain electrode. The first and second electrodes 321 and 322 may be formed of a metal or polysilicon (poly-Si).

The substrate 310 may be a semiconductor substrate, which may be formed of Si, Ge, SiGe, a Group III-V semiconductor, a Group II-VI semiconductor, semiconducting CNTs, $MoS_2$, IZO, GIZO, or the like. The semiconductor substrate 310 may be doped with any one of an n-type dopant and a p-type dopant. As shown in FIG. 9, the semiconductor substrate 310 is opposite to the gate electrode 370 with the graphene layer 350 therebetween. Accordingly, an energy band of the semiconductor substrate 310 may be affected by a gate voltage.

The gate oxide layer 360 may be formed of silicon oxide or silicon nitride.

The formation of the graphene layer 350 may include transferring graphene manufactured using a CVD process and patterning the graphene. The graphene layer 350 may have a multi-layer structure including a plurality of (e.g., 1-4) graphene layers. The graphene layer 350 may be a path through which carriers move, and have a zero or substantially zero bandgap.

Figure 10:
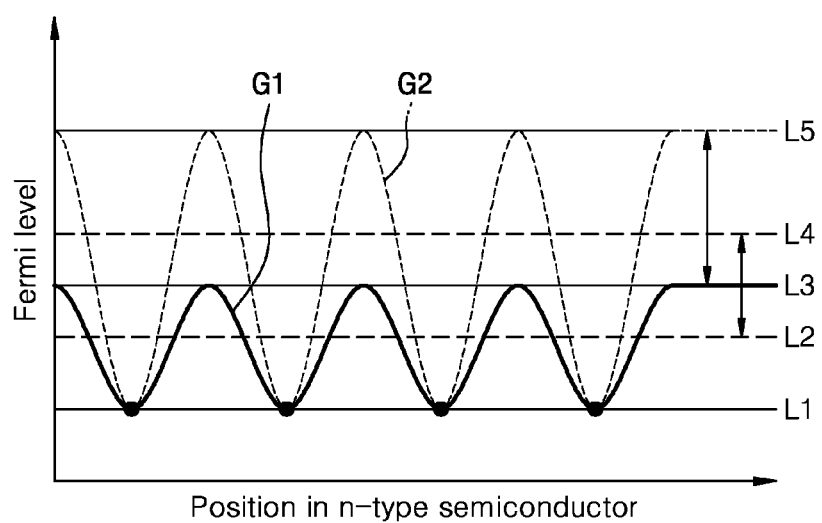
FIG. 10 is a diagram for explaining example functionality of the graphene switching device of FIG. 9.

FIG. 10 is a diagram for explaining example functionality of the example embodiment of the graphene switching device of FIG. 9. In FIG. 10, black circles refer to the metal bumps 330. The semiconductor substrate 310 may be, for example, an n-type silicon substrate. When the metal bumps 330 are formed of a metal having a smaller work function than silicon, a Fermi level of the graphene layer 350 at positions of the metal bumps 330 may be fixed to a level 1 (L1), which corresponds to a Fermi level of the metal bumps 330, and is lower than a level 3 (L3), which corresponds to a Fermi level of the graphene layer 350. Accordingly, as indicated by a first graph G1, the Fermi level of the graphene layer 350 may be expressed as a constant or substantially constant curve between the Fermi level L1 of the metal bumps 330 and the Fermi level L3 of the graphene layer 350. A level 2 (L2) refers to the average Fermi level of the graphene layer 350 in a state in which a gate voltage is not applied.

When a positive gate voltage is applied to the gate electrode 370, the Fermi level of the graphene layer 350 may increase to a level 5 (L5), so the size of the curve between the Fermi level L1 of the metal bumps 330 and the Fermi level L5 of the graphene layer 350 may increase as indicated by a second graph G2.

Accordingly, in the graphene switching device without the metal bumps 330, a driving current may fluctuate between the level 3 (L3) and the level 5 (L5). By comparison, in the graphene switching device with the metal bumps 330, a driving current may fluctuate between the level 2 (L2) and the level 4 (L4). The magnitude of the driving current may be reduced due to the metal bumps 330, thus lowering operating power of the graphene switching device.

Similarly, when the semiconductor substrate 310 is, for example, a p-type substrate and the metal bumps 330 are formed of a metal having a larger work function than the substrate 310, a driving current may be reduced to lower operating power of the graphene switching device. A detailed description thereof is omitted here for the sake of brevity.

An example embodiment of a method of driving the memory array using the graphene switching device 300 shown in FIG. 9 is the same or substantially the same as the method of driving the memory array using the graphene switching device 200 shown in FIG. 2. Thus, a description thereof is omitted.

Figure 11:
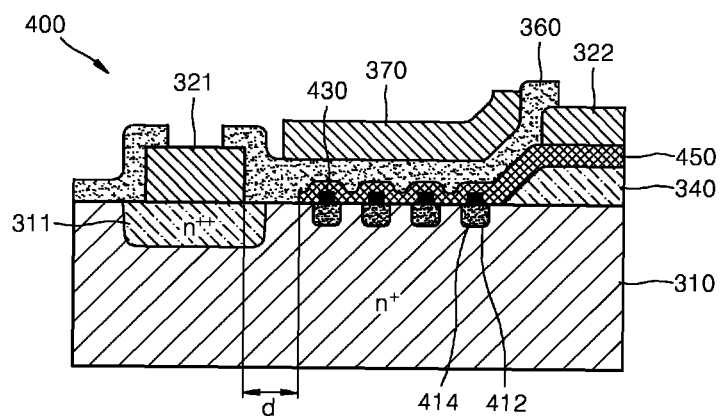
FIG. 11 is a schematic cross-sectional view of another example embodiment of a graphene switching device.

FIG. 11 is a schematic cross-sectional view of another example embodiment of a graphene switching device 400. The example embodiment shown in FIG. 11 is a modified example of the graphene switching device 300 of FIG. 9. The same reference numerals are used to denote the same elements as in the graphene switching device 300, and a detailed description thereof is omitted.

Referring to FIG. 11, a plurality of grooves 412 are formed on a surface of a semiconductor substrate 310. Each of the grooves 412 is filled with an insulating material 414. Metal bumps 430 are on an upper surface of the insulating material 414 and in contact with the graphene layer 350. In this example, the graphene layer 350 surrounds an upper surface and sides of the metal bumps 430 and contacts the substrate 310. The metal bumps 430 may be formed of platinum (Pt), gold (Au), palladium (Pd), cobalt (Co), yttrium (Y), gadolinium (Gd), calcium (Ca), titanium (Ti), an alloy thereof or the like. The metal bumps 430 may have a size of about 1 nm to about 10 nm. The metal bumps 430 may be formed at an interval of about 10 nm to about 30 nm.

A gate oxide layer 360 is formed on the substrate 310 to cover a portion of the graphene layer 350. A gate electrode 370 is formed on the gate oxide layer 360.

Since operation of the graphene switching device 400 including a tunable barrier is the same or substantially the same as the operation of the graphene switching device 300 discussed above, a detailed description thereof is omitted.

Figure 12:
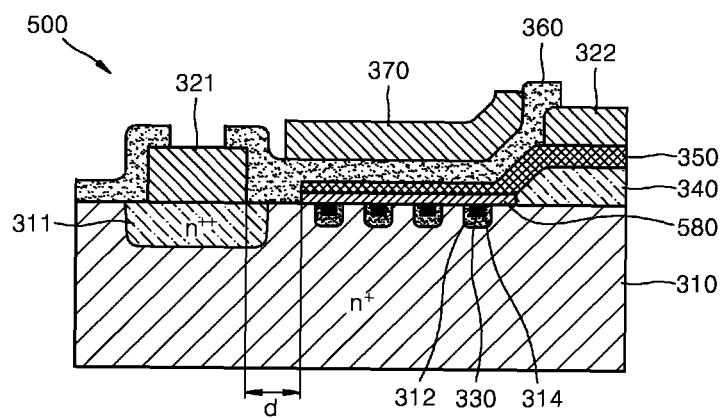
FIG. 12 is a schematic cross-sectional view of yet another example embodiment of a graphene switching device.

FIG. 12 is a schematic cross-sectional view of yet another example embodiment of a graphene switching device 500. The grapheme switching device 500 is another modified example of the graphene switching device of FIG. 9. The same reference numerals are used to denote the same elements as in the graphene switching device 300, and a detailed description thereof is omitted.

Referring to FIG. 12, a plurality of grooves 312 are formed in a surface of a substrate 310. Metal bumps 330 are in the respective grooves 312 and in contact with a graphene layer 350. An insulating material 314 is formed within the grooves 312 to surround the metal bumps 330, and suppress and/or prevent the metal bumps 330 from contacting the substrate 310. The metal bumps 330 may be formed of Pt, Au, Pd, Co, Y, Gd, Ca, Ti, an alloy thereof or the like. The metal bumps 330 may have a size of about 1 nm to about 10 nm and be formed at an interval of about 10 nm to about 30 nm.

An organic layer 580 is formed on a third region of the substrate 310 between the substrate 310 and the graphene layer 350. The organic layer 580 is formed of an organic material containing amino groups, hydroxyl groups, or hydrogen ions. In one example, an organic material containing amino groups may be 1-pyrenebutanamine, cysteamine, or 3-aminopropyltriethoxysilane may be used as an organic material containing amino groups. An organic material containing hydroxyl groups may be 7-hydrobenzo (a) pyrene or 1-pyrenebutanol.

The organic layer 580 may be formed to a thickness of, for example, about 1 nm to about 3 nm, so as to enable tunneling. The organic layer 580 may be bonded to dangling bonds of the surface of the substrate 310 and vary a Fermi level of the graphene layer 350 of the substrate 310. For example, the organic layer 580 may be bonded to the metal bumps 330 and increase a variation in the Fermi level of the graphene layer 350.

Since operation of the graphene switching device 500 including a tunable barrier in FIG. 12 is the same or substantially the same as the operation of the graphene switching device 300 including the tunable barrier described above, a detailed description thereof is omitted.

Although the graphene switching device 500 of FIG. 12 demonstrates that an organic layer may be applied to the graphene switching device 500, example embodiments are not limited thereto. For instance, the organic layer 580 in FIG. 12 may be between the semiconductor substrate 310 and the graphene layer 350 to cover the metal bumps 330 in the graphene switching device 400 of FIG. 11.

Since a memory array including graphene switching devices according to example embodiments may be configured without an additional storage node, the memory array may be structurally simplified.

It should be understood that the example embodiments described therein should be considered in a descriptive sense only and not for purposes of limitation. Descriptions of features or aspects within each example embodiment should be considered as available for other similar features or aspects in other example embodiments.

What is claimed is:
1. A memory device comprising:
a graphene switching device having a source electrode, a drain electrode, and a gate electrode, and the graphene switching device including a Schottky barrier between the drain electrode and a channel in a direction from the source electrode toward the drain electrode, wherein
the graphene switching device further includes
a conductive semiconductor substrate, wherein
the drain electrode is on a first region of the conductive semiconductor substrate, and an insulating layer is on a second region of the conductive semiconductor substrate, the first and second regions being spaced apart from each other;
a semi-metal layer on the conductive semiconductor substrate between the drain electrode and the insulating layer, the semi-metal layer extending onto the insulating layer, the semi-metal layer being a conductive layer, and the semi-metal layer being configured to function as the channel, wherein
the source electrode is on the semi-metal layer; and
a gate oxide layer on the semi-metal layer, wherein
the gate electrode is on the gate oxide layer,
the conductive semiconductor substrate forms the Schottky barrier between the semi-metal layer and the drain electrode,
the insulating layer is between the semi-metal layer and the conductive semiconductor substrate, and
the insulating layer is entirely above the surface of the conductive semiconductor substrate.

2. The memory device of claim 1, further comprising:
a plurality of graphene switching devices arranged in a plurality of rows and a plurality of columns, each of the plurality of graphene switching devices having a source electrode, a drain electrode, and a gate electrode, and each of the plurality of graphene switching devices including a Schottky barrier between the drain electrode and a channel in a direction from the source electrode toward the drain electrode.

3. The memory device of claim 2, further comprising:
a plurality of word lines, each of the plurality of word lines being connected to gate electrodes of graphene switching devices on a corresponding column;
a plurality of bit lines, each of the plurality of bit lines being connected to drain electrodes of graphene switching devices on a corresponding row; and
a plurality of source lines, each of the plurality of source lines being connected to source electrodes of graphene switching devices on a corresponding column.

4. The memory device of claim 1, wherein the substrate includes at least one of silicon (Si), germanium (Ge), silicon-germanium (SiGe), a Group III-V semiconductor, a Group II-VI semiconductor, semiconductor carbon nanotube (CNT), molybdenum sulfide ($MoS_2$), indium zinc oxide (IZO), and gallium indium zinc oxide (GIZO).

5. The memory device of claim 1, wherein the drain electrode is spaced apart from the semi-metal layer.

6. The memory device of claim 5, wherein a distance between the semi-metal layer and the drain electrode ranges from about 1 nm to about 30 nm.

7. The memory device of claim 1, wherein the semi-metal layer is a graphene layer or a metal carbon nanotube (CNT) mesh.

8. The memory device of claim 7, wherein the graphene layer includes has a multi-layer structure including a plurality of graphene layers.

9. The memory device of claim 1, wherein the drain electrode and the source electrode are formed of a metal or poly-silicon (poly-Si).

10. The memory device of claim 1, wherein a height of the Schottky barrier varies according to a voltage applied to the gate electrode.

11. A memory device comprising:
a graphene switching device having a source electrode, a drain electrode, and a gate electrode, and the graphene switching device including a Schottky barrier between the drain electrode and a channel in a direction from the source electrode toward the drain electrode, the graphene switching device further including
a conductive semiconductor substrate, wherein
the drain electrode is on a first region of the substrate, and an insulating layer is on a second region of the substrate;
a plurality of metal bumps on the substrate between the first region and the second region;
a semi-metal layer on the plurality of metal bumps and extending onto the insulating layer, wherein
the source electrode is on the semi-metal layer in the second region; and
a gate oxide layer on the semi-metal layer, wherein
the gate electrode on the gate oxide layer, and
the substrate forms the Schottky barrier between the semi-metal layer and the drain electrode.

12. The memory device of claim 11, further comprising:
a plurality of grooves on a surface of the substrate, the plurality of grooves corresponding to the plurality of metal bumps; and
an insulating material filling the plurality of grooves.

13. The memory device of claim 12, wherein the plurality of metal bumps are surrounded by the insulating material and upper surfaces of the plurality of metal bumps contact the semi-metal layer.

14. The memory device of claim 12, wherein the plurality of metal bumps are on the insulating material and have top surfaces that contact the semi-metal layer.

15. The memory device of claim 12, further comprising:
an organic layer between the plurality of metal bumps and the semi-metal layer.

16. The memory device of claim 15, wherein the organic layer includes an organic material selected from a group including an amino group, a hydroxyl group, and a hydrogen ion.

17. The memory device of claim 15, wherein the organic layer has a thickness of about 1 nm to about 3 nm.

18. The memory device of claim 11, wherein the plurality of metal bumps have a size of about 1 nm to about 10 nm.

19. The memory device of claim 11, wherein the plurality of metal bumps are arranged at intervals of about 10 nm to about 30 nm.

20. A memory device comprising:
a graphene switching device having a source electrode, a drain electrode, and a gate electrode, and the graphene switching device including a Schottky barrier between the drain electrode and a channel in a direction from the source electrode toward the drain electrode, wherein
the graphene switching device further includes
a conductive semiconductor substrate, wherein
the drain electrode is on a first region of the conductive semiconductor substrate, and an insulating layer is on a second region of the conductive semiconductor substrate, the first and second regions being spaced apart from each other;
a semi-metal layer on the conductive semiconductor substrate between the drain electrode and the insulating layer, the semi-metal layer extending onto the insulating layer such that a first portion of the semi-metal layer is on a surface of the conductive semiconductor substrate and a second portion of the semi-metal layer is on a surface of the insulating layer, the semi-metal layer being a conductive layer, and the semi-metal layer being configured to function as the channel, wherein
the source electrode is on the semi-metal layer; and
a gate oxide layer on the semi-metal layer, wherein
the gate electrode is on the gate oxide layer,
the conductive semiconductor substrate forms the Schottky barrier between the semi-metal layer and the drain electrode, and
a bottom surface of the second portion of the semi-metal layer on the insulating layer is raised relative to a bottom surface of the first portion of the semi-metal layer on the surface of the conductive semiconductor substrate.

* * * * *